(12) United States Patent
Heimbuch et al.

(10) Patent No.: US 9,157,791 B2
(45) Date of Patent: Oct. 13, 2015

(54) ACTIVELY ALIGNED DETECTORS FOR OPTICAL AND OPTOELECTRONIC ARRAYS

(71) Applicants: Mark Heimbuch, Chatsworth, CA (US); E-Min Chou, Chengdu (CN)

(72) Inventors: Mark Heimbuch, Chatsworth, CA (US); E-Min Chou, Chengdu (CN)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 183 days.

(21) Appl. No.: 13/824,165

(22) PCT Filed: Mar. 14, 2013

(86) PCT No.: PCT/CN2013/072626
§ 371 (c)(1),
(2) Date: Mar. 15, 2013

(87) PCT Pub. No.: WO2014/139128
PCT Pub. Date: Sep. 18, 2014

(65) Prior Publication Data
US 2014/0263970 A1    Sep. 18, 2014

(51) Int. Cl.
*G01J 1/04* (2006.01)
*H01L 25/00* (2006.01)

(52) U.S. Cl.
CPC ............... *G01J 1/0411* (2013.01); *H01L 25/50* (2013.01); *H01L 2924/00* (2013.01); *H01L 2924/0002* (2013.01)

(58) Field of Classification Search
USPC ............... 250/216, 221, 214 R, 214.1, 208.2, 250/208.1; 359/619, 613; 385/17, 16, 18, 385/24, 31, 33, 47; 356/419, 326, 328, 416
See application file for complete search history.

(56) References Cited

U.S. PATENT DOCUMENTS

| 7,683,310 | B1 * | 3/2010 | Sinclair et al. ................ 250/216 |
| 2012/0001083 | A1 * | 1/2012 | Knapp ..................... 250/370.12 |

\* cited by examiner

*Primary Examiner* — Francis M Legasse, Jr.
(74) *Attorney, Agent, or Firm* — Andrew D. Fortney; Central California IP Group, P.C.

(57) ABSTRACT

A multi-channel optical device and method of making the same are disclosed. The optical device includes a plurality of detectors on a detector mounting substrate, and a corresponding plurality of lenses on an interior surface of the optical device. Each detector detects light having a unique center wavelength. Each center wavelength corresponds to a channel of the optical device. Each lens focuses light towards a corresponding detector. Each detector has a location corresponding to a focal point of the light focused by a corresponding lens. The method of making the optical device includes placing lenses on a surface of the optical device housing, transmitting light having a plurality of center wavelengths through the lenses, determining locations on a detector mounting substrate where each light beam is focused by a lens, and placing a detector at each location.

20 Claims, 6 Drawing Sheets

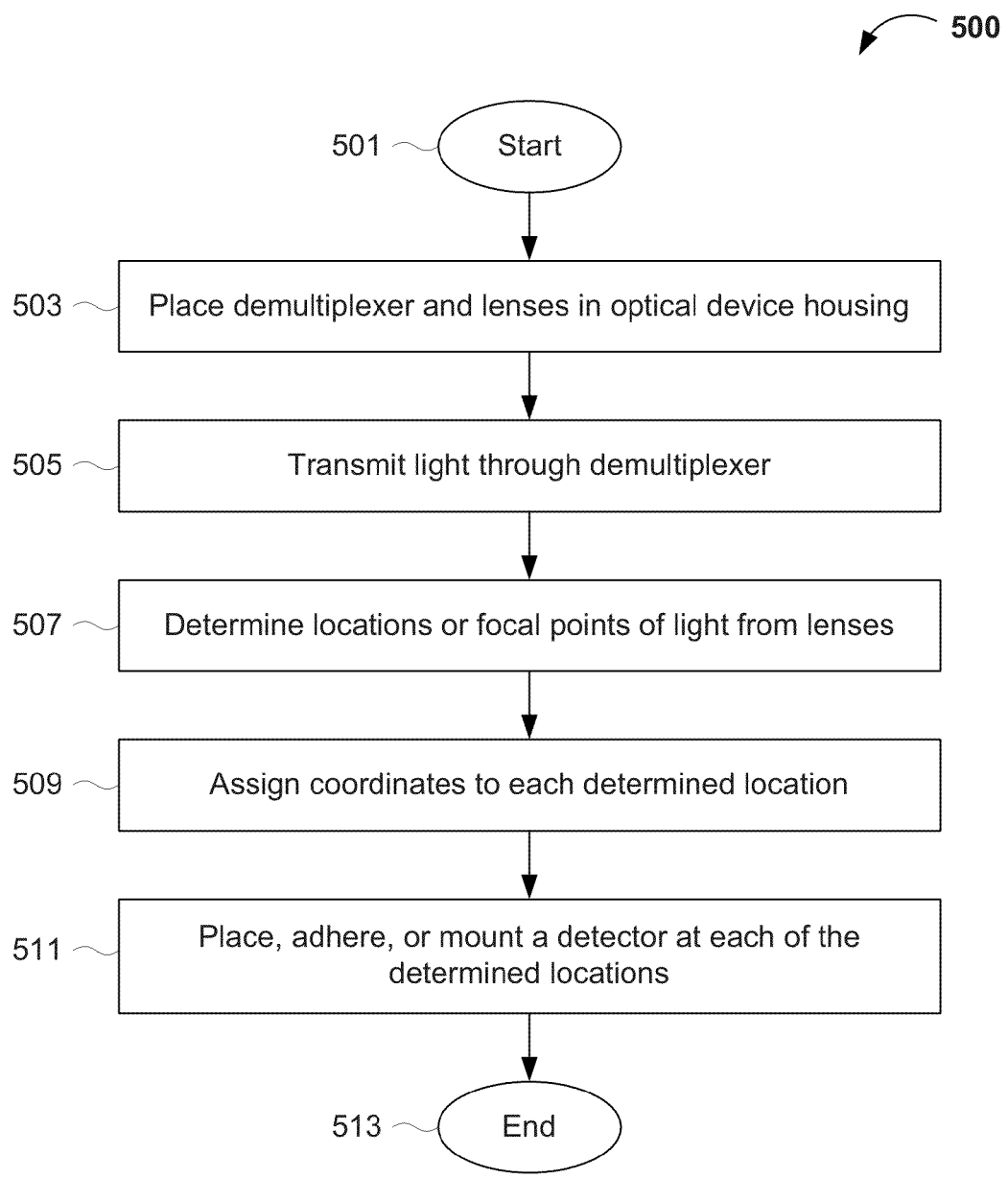

ACTIVELY ALIGNED DETECTORS FOR OPTICAL AND OPTOELECTRONIC ARRAYS

FIELD OF THE INVENTION

The present invention generally relates to the field of light-detecting and/or optical signal receiving devices. More specifically, embodiments of the present invention pertain to actively aligned detectors for a multi-channel light-detecting and/or optical signal receiving device.

DISCUSSION OF THE BACKGROUND

Light-detecting devices such as photodiodes are useful for optical signal reception in optoelectronic networks. Optical signal reception may include reception of multiple channels (or wavelengths) of light (i.e., a multi-channel signal). One approach to receiving a multi-channel signal is the use of multiple cascaded detectors configured to detect light of different wavelengths.

A cascaded detector array in a receiver optical sub-assembly (ROSA) equipped with multiple lenses for focusing the light on individual detectors may receive one or more signals (e.g., light beams) having a focal point that is not perfectly on axis, or in alignment, with a center line of the light beam(s). Also, in such multi-channel systems, the focal points of different signals or light beams may not be equally spaced apart.

Newer generations of multi-channel optical receivers may require four or more detectors mounted within a small area of the ROSA package or substrate. However, small packaging typically does not allow for typical free space alignment. Also, small transceiver (e.g., ROSA) packaging may have narrow wavelength filtering requirements. Furthermore, in a cascaded wavelength drop design (e.g., where successive channels have center wavelengths that differ in a particular direction and/or by a predetermined amount), there is a need for an extra degree of freedom to allow for the use of individual filters with the lens array.

For example, referring to FIG. 1, a multi-channel receiver optical sub-assembly (ROSA) 100 can use passive elements with collimated beams 141, 143, 145 and 147 that emerge from a multiplexer/demultiplexer 120 and integrated lenses 132, 134, 136 and 138. This design is intended to achieve exact X-Y focal points 142, 144, 146 and 148 so that a detector array (not shown) can be placed at the focal points. In FIG. 1, this is represented by equal distances X between adjacent focal points 142 and 144, 144 and 146, and 146 and 148 along the X axis (i.e., the line parallel to and above a line bisecting the four lenses 132-138), with zero offset along the Y axis. A detector array can be placed on a substrate such as a printed circuit board with high precision die attach equipment. Then, the detector array and/or a fiber to be inserted into opening 113 in ROSA substrate/package 110 can be aligned to achieve maximum responsivity or sensitivity in the detectors. Unfortunately, any beam misalignment from the intended X-Y target 142, 144, 146 or 148 of one detector relative to the other detectors cannot be corrected with this method of alignment.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to a multi-channel optical or optoelectronic device, and to methods, architectures, software, and/or systems for making and/or using such an optical or optoelectronic device, having individually positioned detectors. The optical devices having such individually positioned detectors and/or filters are useful in multi-channel optoelectronic networks.

In one embodiment, the invention relates to a multi-channel optical or optoelectronic device, comprising a plurality of detectors on or affixed to a detector mounting substrate, and a corresponding plurality of lenses on or affixed to an interior surface of the multi-channel optical or optoelectronic device. Each lens is configured to focus light of the unique wavelength or wavelength band towards a corresponding one of the detectors, and each detector is configured to detect light having a unique one of a plurality of wavelengths or wavelength bands, and has a location corresponding to a focal point of the light having the unique wavelength or wavelength band focused by a corresponding one of the lenses. Thus, each of the wavelengths or wavelength bands corresponds to a channel of the multi-channel optical or optoelectronic device. Generally, each detector comprises a photodiode configured to absorb light of the unique wavelength or wavelength band. The detectors may be spaced apart from one another such that a distance from a center of one detector to a center of an adjacent detector is about 200 µm to 5,000 µm.

In various embodiments of the device, the detector mounting substrate comprises a printed circuit board, and the interior surface of the multi-channel optical or optoelectronic device is a receiver optical subassembly (ROSA) surface facing the printed circuit board. The device may further comprise a demultiplexer and/or a plurality of amplifiers. The demultiplexer is configured to (i) receive a multi-channel optical signal having each of the plurality of wavelengths or wavelength bands and (i) separate the multi-channel optical signal into individual optical signals, each having the unique wavelength or wavelength band. The demultiplexer may comprise a plurality of filters and/or beam splitters, and optionally, one or more mirrors. Each filter and/or beam splitter is configured to separate one of the individual optical signals from a received signal having more than one of the individual optical signals. The mirror(s) may reflect the individual optical signal separated by the corresponding filter and/or beam splitter towards the corresponding lens. Each amplifier may be mounted on the printed circuit board, and may amplify an electrical signal output by a corresponding one of the detectors.

In another embodiment, a method of forming an optical or optoelectronic device generally comprises placing a plurality of lenses on a surface of an optical or optoelectronic device housing or package, transmitting light having a plurality of wavelengths or wavelength bands through the plurality of lenses, determining a plurality of locations on a detector mounting substrate in the optical or optoelectronic device housing or package where the light of each wavelength or wavelength band is focused by a corresponding one of the plurality of lenses, and placing, adhering or mounting a detector at or on each of the plurality of locations. Generally, each of the wavelengths or wavelength bands corresponds to one of the lenses.

In various embodiments of the method, determining the plurality of locations comprises determining a respective focal point of the light of each wavelength or wavelength band. In further embodiments, the detector mounting substrate comprises a printed circuit board, and determining the plurality of focal points comprises mapping coordinates of each focal point on the printed circuit board.

The method may further comprise assigning coordinates to each of the locations after the plurality of locations has been determined. In such embodiments, a first set of coordinates may be assigned to a first detector, and the remaining coordinates (or sets of coordinates) for the remaining locations are assigned relative to the first set of coordinates. Each detector is placed, adhered or mounted at or on its corresponding location using its assigned coordinates. In other or further embodiments, the method may further comprise storing information relating to the plurality of locations and using the stored information to place, adhere or mount each detector.

Such methods, software, systems and devices advantageously provide a detector array on a receiver assembly or housing surface (e.g., a ROSA sub-mount) that is custom-built for each receiver. Thus, optimized one-step alignment can be achieved on a device-level basis. The present invention enables individual detector arrays that are optimally matched for use with specific ROSA units. By determining an ideal location for each detector prior to placement of the detectors, each detector array may be individually optimized. Thus, an extra degree of alignment freedom can come from the detector placement process, the performance of each device may be improved or increased, and the yield of the manufacturing process may be improved or increased.

However, such systems, methods, etc. can also be applied to devices other than receiver arrays in optical or optoelectronic devices. For example, any type of integrated multi-channel system or method that can place or position individual detectors individually can benefit from the present invention. The present optical or optoelectronic devices may be useful for optical communications and other uses.

These and other advantages of the present invention will become readily apparent from the detailed description of various embodiments below.

BRIEF DESCRIPTION OF THE DRAWINGS

FIG. 6 is a flow chart showing an exemplary method of positioning detectors in an optical device housing in accordance with embodiments of the present invention.

DETAILED DESCRIPTION

Figure 1:
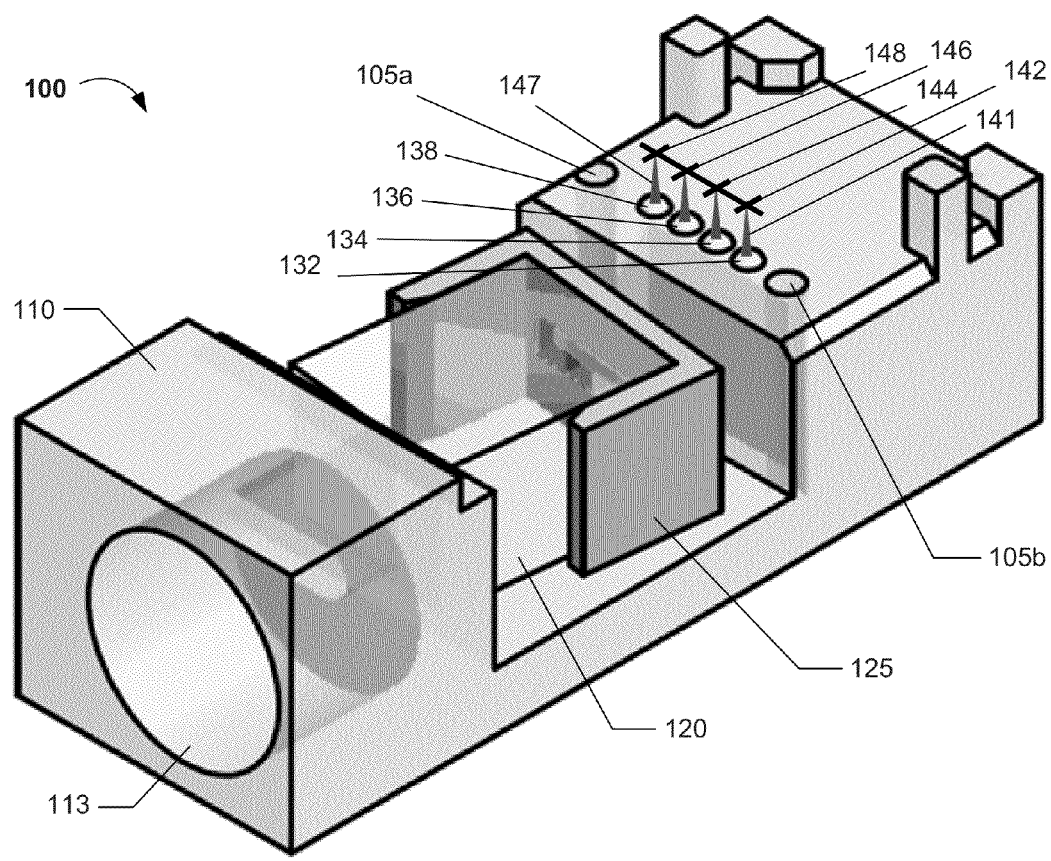
FIG. 1 shows a portion of an exemplary four-channel optical receiver.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the disclosure.

Unless specifically stated otherwise, or as will be apparent from the following discussions, it is appreciated that throughout the present application, discussions utilizing terms such as "processing," "operating," "calculating," "determining," or the like, refer to the action and processes of a computer, data processing system, or similar processing device (e.g., an electrical, optical, or quantum computing or processing device or circuit) that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data or information similarly represented as physical quantities within other components of the same or a different system or architecture.

Furthermore, in the context of this application, the terms "signal" and "optical signal" refer to any known structure, construction, arrangement, technique, method and/or process for physically transferring a signal or optical signal, respectively, from one point to another. Also, unless indicated otherwise from the context of its use herein, the terms "designated," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

For the sake of convenience and simplicity, the terms "laser" and "light source" are generally used interchangeably herein, and use of one such term generally includes the others, as are the terms "detector" and "photodiode," but these terms are generally given their art-recognized meanings herein. The terms "thickness" or "height" may also be used interchangeably, but both, in the context of this application, are meant to refer to a vertical measurement from a substantially horizontal reference surface.

For the sake of convenience and simplicity, the terms "optical" and "optoelectronic" are generally used interchangeably herein, and use of either of these terms also includes the other, unless the context clearly indicates otherwise. Additionally, the term "transceiver" refers to a device having at least one receiver and at least one transmitter, and use of the term "transceiver" also includes the terms "receiver" and/or "transmitter," unless the context clearly indicates otherwise. Also, for convenience and simplicity, the terms "connected to," "coupled with," "communicating with," and "coupled to" (which terms also refer to direct and/or indirect relationships between the connected, coupled and/or communicating elements unless the context of the term's use unambiguously indicates otherwise). Such terms may be used interchangeably, but these terms are also generally given their art-recognized meanings. Various embodiments and/or examples disclosed herein may be combined with other embodiments and/or examples, as long as such a combination is not explicitly disclosed herein as being unfavorable, undesirable or disadvantageous. The invention, in its various aspects, will be explained in greater detail below with regard to exemplary embodiments.

An Exemplary Multi-Channel Light-Receiving Device

FIG. 1 shows an exemplary multiple-channel optical signal assembly 100, receiving a single multi-channel optical signal (e.g., from a fiber to be connected at connector 113) and detecting a plurality of individual optical signals 141, 143, 145 and 147. The optical signal assembly 100 comprises a housing 110, a demultiplexer 120, a demultiplexer mount 125, one or more mirrors (not shown), and a lens array comprising lenses 132, 134, 136 and 138. Four optical signal paths are present in the example of FIG. 1 (e.g., corresponding to a 4-channel optical receiver), although any number of channels may be possible in accordance with the present invention.

As shown, multi-channel optical signal assembly 100 is configured to receive an multi-channel optical signal from an optical medium (e.g., a fiber optic cable) connected to the assembly 100 at connector 113. The optical signal medium carries the optical signal from an optical transmitter elsewhere in the optical or optoelectronic network. The multi-channel optical signal is received by demultiplexer 120, where it is separated into its component signals.

Each component of the multi-channel optical signal has a unique center wavelength, which may represent or characterize light in a relatively narrow wavelength band. The center wavelengths of each component signal may be separated by, e.g., 4 nm or more, 5 nm or more, 10 nm or more, etc. After separation, the individual component signals exit the demultiplexer 120 through an opening in the demultiplexer mount 125.

Figure 2:
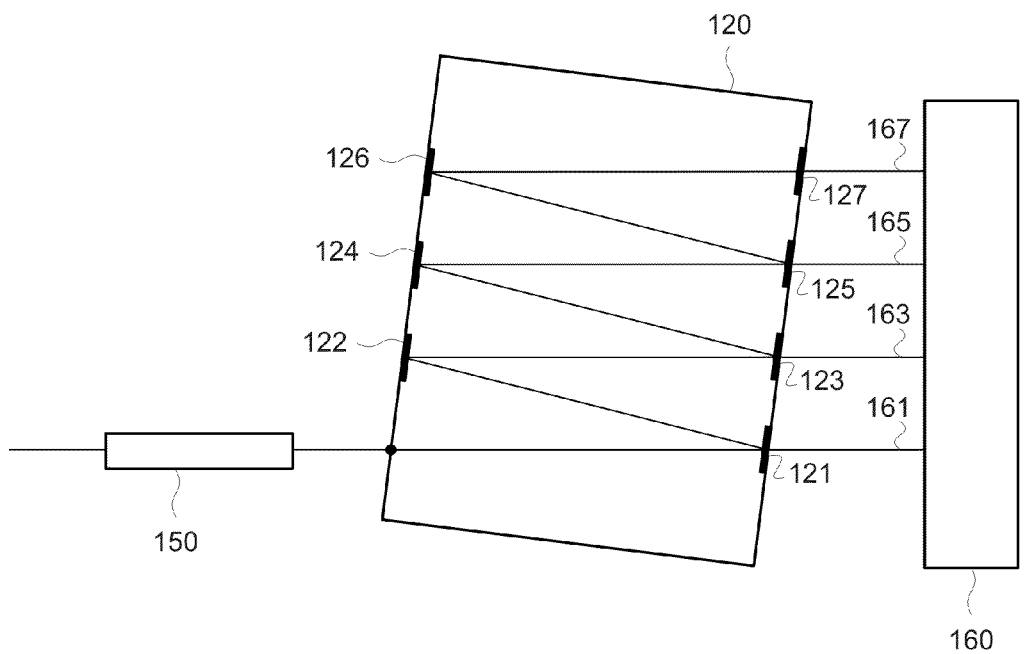
FIG. 2 shows an exemplary demultiplexer useful for a multi-channel optical receiver in accordance with embodiments of the present invention.

FIG. 2 shows an exemplary demultiplexer 120 suitable for use in the present invention. Demultiplexer 120 receives a multi-channel optical signal 155 from an optical transmission medium 150, and separates the multi-channel optical signal 155 into its component signals 161, 163, 165 and 167, which are reflected by a mirror 160 towards the lenses (not shown in FIG. 2). The optical transmission medium 150 is secured in the receiver optical subassembly at the connector 113 (FIG. 1). Mirror 160 may also comprise a plurality of mirrors, each reflecting one or more of the component signals 161, 163, 165 and 167, which may be advantageous when the lenses are not collinear (e.g., along a single axis) or when a filtering function is desired. Demultiplexer 120 has a substantially rectangular shape, and has surfaces or walls facing the optical medium 150 and the mirror 160 oriented at an angle relative to the incoming multi-channel signal 155 and the outgoing individual signals 161, 163, 165 and 167, respectively. This angle facilitates separation of the multi-channel signal 155 into its individual component signals 161, 163, 165 and 167.

Demultiplexer 120 comprises a plurality of filters and/or beam splitters 121, 123, 125 and 127, and mirrors 122, 124 and 126. Each filter and/or beam splitter 121, 123, 125 and 127 may comprise a dichroic mirror or other device configured to allow light within a predetermined wavelength band (e.g., having a width of no more than 4 nm, 5 nm, 10 nm, 12 nm, 20 nm, etc.) to pass through, while reflecting other light. Thus, light having a first center wavelength corresponding to the first optical signal 161 passes through the first filter or beam splitter 121, while light of the other optical signals in multi-channel signal 155 is reflected by the first filter or beam splitter 121. The light of the three remaining optical signals is reflected by a first mirror 122 to second filter or beam splitter 123, which is substantially transparent to light having a second center wavelength corresponding to the second optical signal 163, but the light of the remaining two optical signals in the multi-channel signal is reflected to a second mirror 124. Mirror 124 reflects the remaining optical signals to a third filter or beam splitter 123, which is substantially transparent to light having a third center wavelength corresponding to the third optical signal 165, but reflective to the light of the remaining optical signal. Mirror 126 reflects the last remaining optical signal 167 through a fourth filter 127 towards the mirror 160. The mirrors 122, 124 and 126 may be selective or nonselective (e.g., they may selectively reflect light within a certain wavelength band, while not reflecting other light), and they may be replaced with a single nonselective mirror along the same surface of the optical receiver as mirrors 122, 124 and 126. The fourth filter 127 is optional (e.g., the demultiplexer 120 may simply have an opening in its wall at the location of the fourth filter 127).

Referring back to FIG. 1, the light of the individual component signals is reflected by a mirror (e.g., mirror 160 in FIG. 2) towards the individual lenses 132-138. The mirror (not shown in FIG. 1) is mounted in the right-hand portion of the assembly 110, under the lenses 132-138. The individual component signals are focused by corresponding individual lenses 132-138. The target locations 142, 144, 146 and 148 for the focal points of the light beams 141, 143, 145 and 147 focused by lenses 132-138 are equally spaced apart along an axis parallel to and above a line bisecting the lenses 132-138.

However, due to variations in placement of various components of the receiver, flaws or irregularities in the components or on the surface of the components, etc., the light beams 141, 143, 145 and 147 may have focal points that are not on the axis or perfectly spaced along the axis. Consequently, each detector may have a location in the receiver based on the focal point of the light beam 141, 143, 145 or 147.

Figure 3:
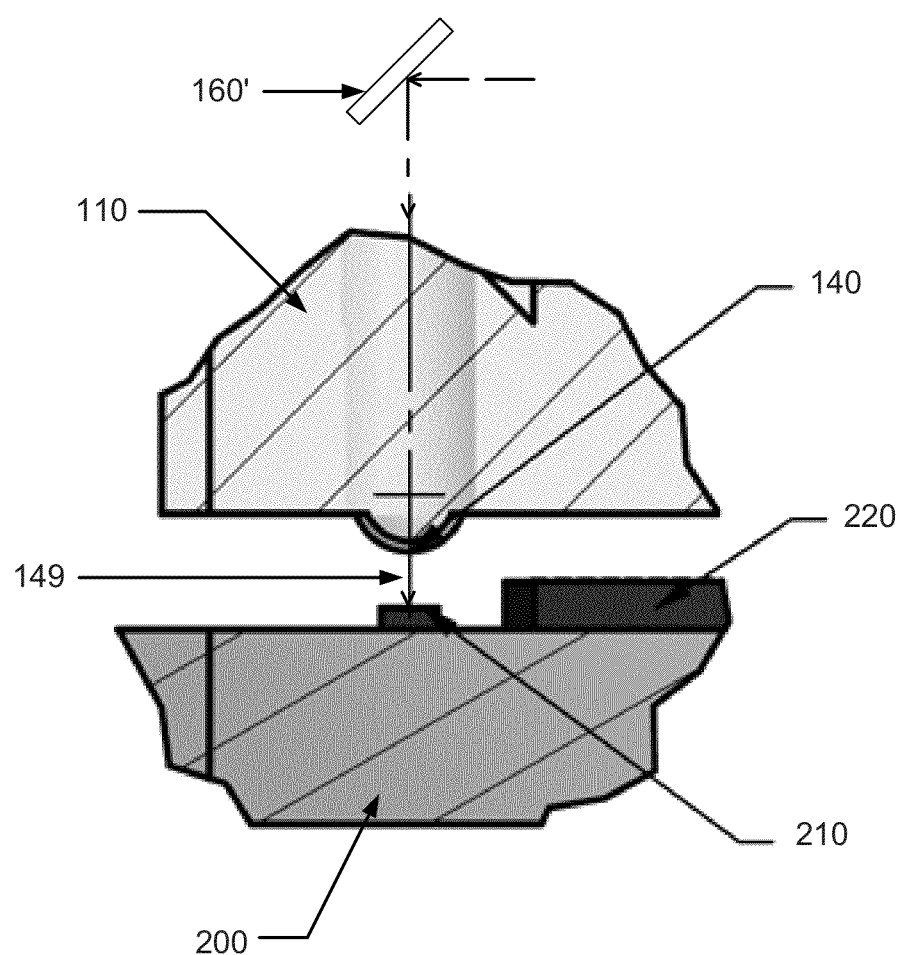
FIG. 3 is a cross-section of an exemplary light path showing an exemplary lens focusing a light beam onto an exemplary detector (photodiode) in accordance with embodiments of the present invention.

Referring now to FIG. 3, a cross-section of a portion of the optical signal assembly housing 110 including lens 142 and a portion of a circuit board 200 facing the optical signal assembly housing 110 and lens 142 are shown. The circuit board 200 includes a detector 210 and a transimpedance amplifier 220, and may comprise a ceramic material or layer on a board material. The detector 210 is configured to receive an optical signal on one channel from the demultiplexer (not shown in FIG. 3) via mirror 160', and convert the optical signal to an analog electrical signal. The transimpedance amplifier 220 is configured to amplify the analog electrical signal for downstream processing in the optical receiver.

Optical signal 161 from demultiplexer 120 (FIG. 2) is reflected by mirror 160 towards the lens 142, which focuses the optical signal at a focal point. The location of the focal point of the focused optical signal 141 can be affected by a large number of factors, and as a result, the true focal point of the focused optical signal 141 may not coincide with or be the same as the target focal point location (e.g., location 141 in FIG. 1). The detector 210 on circuit board 200 has a relatively small size, and thus, alignment of the focal point of the focused optical signal 141 with the position of the detector 210 may be critical to functionality or operation of the optical receiver. In general, detector 210 comprises a photodiode, usually in the form of a semiconductor die or chip (e.g., a multi-layer film on a single-crystal or insulative substrate, the film having or forming one or more light-sensitive PN or PIN junctions). Such detector chips may have linear dimensions (e.g., a length and/or width) of from about 70 to 700 μm (for example, approximately 200 μm). Thus, the detector chip may have an area (e.g., length times width) of from about 5000 to about 500,000 μm (for example, approximately 40,000 μm$^2$). The active area of the detector 210 is generally from about 80 to 8000 μm (for example, about 2,000 μm$^2$). Also, the spacing between adjacent detectors (e.g., as defined by their center-to-center distance) may be from about 100 to about 5000 μm (for example, about 750 μm). Thus, there is generally sufficient margin (e.g., extra space on the circuit board 200) to place the detectors, including detector 210, in an optimal location, coinciding or aligned with the focal point of the focused optical signal 141, thereby maximizing functionality and/or performance of the optical receiver.

Placement resolution of conventional die placement equipment (e.g., surface mount die bonders or pick-and-place die placement machines) is generally on the order of ±1 μm or more (e.g., ±1.5 μm, 2 μm, ±3 μm, ±5 μm, etc.). Thus, the detectors in the present optical or optoelectronic receiver may each have a location corresponding to the measured focal points of the optical signal that it receives.

Referring back to FIG. 1, optical signal assembly housing 110 generally includes alignment holes 105*a-b*. The alignment holes 105*a-b* facilitate proper alignment of the focal point location test device (e.g., a test strip or test board comprising a plurality of beam position detectors [see, e.g., FIG. 4], or a multi-channel parallel optical cable configured to determine the location of the focused light beams 141, 143, 145 and 147) and/or the detector mounting substrate with the lenses 132-138. Optical signal assembly 100 may further comprise an optical assembly housing configured to surround and physically protect the detectors (not shown), the detector mounting substrate, and the lenses, among other components.

Figure 4:
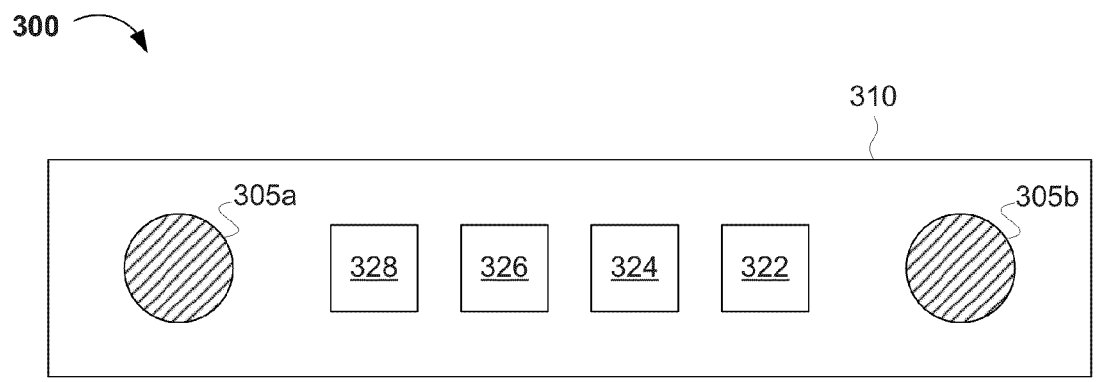
FIG. 4 shows an exemplary test strip or test board useful for determining placement coordinates for detectors in a multi-channel optical receiver in accordance with embodiments of the present invention.

FIG. 4 shows an exemplary test strip 300 suitable for determining the focal point of each focused optical signal (e.g., 141, 143, 145 and 147 if FIG. 1). Test strip 300 comprises a circuit board 310, first through fourth beam position detectors 322, 324, 326 and 328, and first and second alignment pins 305*a-b*. The first and second alignment pins 305*a-b* generally mate with the first and second alignment holes 105*a-b* in the optical signal assembly housing 110 adjacent to the lens array 130, and thus align the beam position detectors 322, 324, 326 and 328 with the corresponding lenses (e.g., 132, 134, 136 and 138 in FIG. 1). Alignment pins 305*a-b* (FIG. 4) may be further configured to reversibly secure (e.g., using a bolt or screw mechanism with a nut, ring, gasket or other offset mechanism) the test strip 300 a predetermined distance away from the optical receiver housing (e.g., housing 110 in FIG. 1).

In one embodiment, each of the first through fourth beam position detectors 322, 324, 326 and 328 may comprise an image sensor. The image sensor may have an area generally the same as that of the detector in the optical receiver, or slightly greater than that of the detector. The image sensor may have a resolution (pixel size) at least slightly greater (e.g., at least 2, 5 or 10 times greater) than the resolution of the equipment used to place the detector on the detector mounting substrate. Thus, high resolution equipment is not necessary for implementation of the present invention. The image sensor or other beam position detector can be electrically connected to an amplifier (not shown) on the test strip or test board, which is, in turn, communicatively couple to a wire or bus in a parallel cable that transmits the beam location information to a computer or other similar information storage and processing device. The information storage and processing device then provides the beam location information to a detector placing machine (e.g., a pick-an-place or other die attach machine) that then places the detectors in the optimized and/or customized locations.

As a result, one or more detectors in the present optical receiver may have a location at least 1 μm away from a target location for the detector. For example, if the target locations for the detectors are along an axis, as in the example of FIG. 1, then the target locations may be defined or described as a set of coordinates (0,0), (x,0), (2x,0), . . . (n·x,0), where x is the center-to-center spacing of the detectors, and n is one less than the number of detectors in the optical receiver. According to the present invention, a detector may have an actual location (as defined by its center coordinates) of ([m·x]±a, [k·y]±b), where m is the number of detectors between the positioned detector and the first detector, a is the offset of the focal point along the x-axis from the target location, y is a predetermined or fixed unit offset of the positioned detector from y=0, k is a predetermined number of units (e.g., corresponding to the target location of the positioned detector), and b is the offset of the focal point along the y-axis from the target location.

Generally, the first detector having a target location at (0,0) may have an actual location at (a,0), (−a,0), (0,b), (0,−b), (a,b), (−a,b), (a,−b), or (−a,−b), depending on the focal point of the optical signal it receives. In such embodiments, a and b are each at least 1 μm, and are generally an integer multiple of the resolution of the detector placement equipment. Other detectors can have similar offsets form their target locations, as described herein.

Therefore, by placing detectors at locations defined by such coordinates, the multi-channel optical signal assembly apparatus 100 receives a multi-channel optical signal from a single-fiber optical medium with maximum sensitivity and/or minimal loss of power and/or intensity as a result of optimal and/or ideal placement of the optical detectors with respect to the focal point of each component signal in the multi-channel optical signal.

Figure 5A:
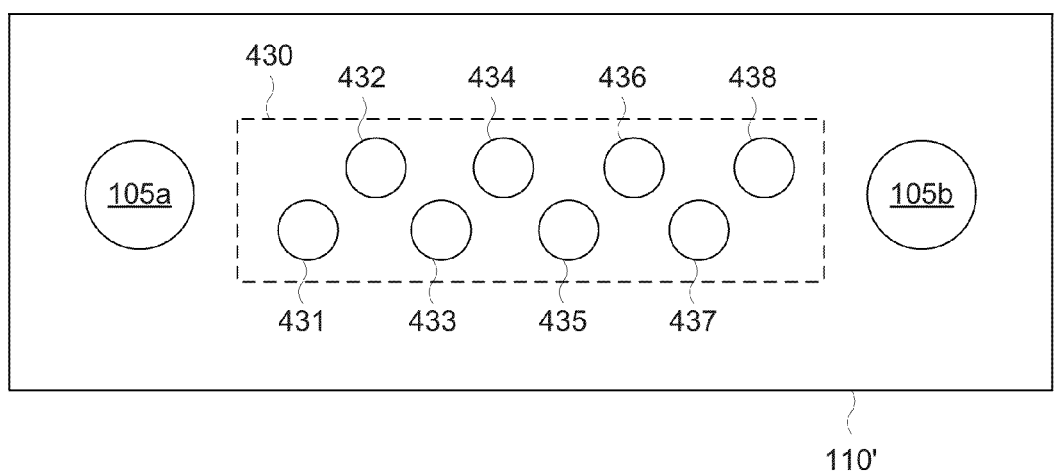
FIGS. 5A-B show an exemplary lens array and set of target detector coordinates in a second multi-channel optical receiver in accordance with embodiments of the present invention.
Figure 5B:
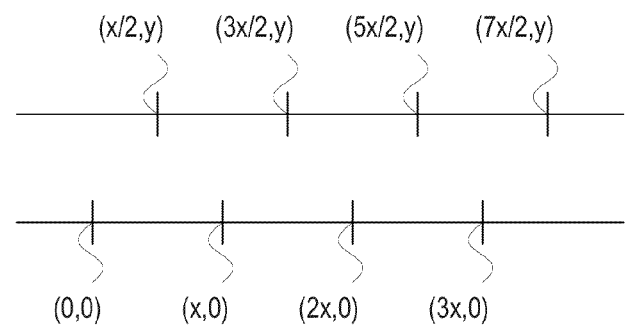
Figure 5C:
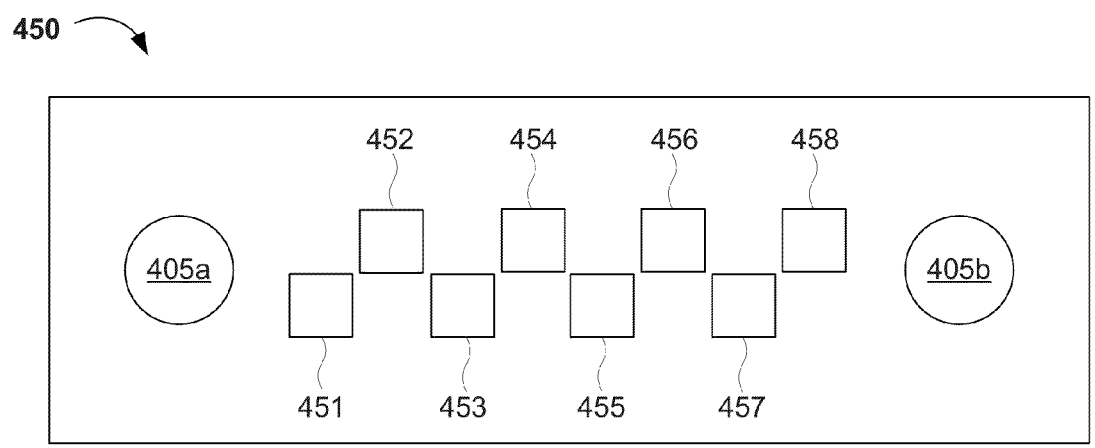
FIG. 5C shows an exemplary test board for determining detector locations in accordance with the present invention.

An Exemplary Lens Array and Corresponding Test Board for Determining Detector Locations FIGS. 5A-C show another exemplary lens array (FIG. 5A) suitable for use in a multiple-channel optical receiver, a corresponding set of target detector locations (FIG. 5B) along two axes in a Cartesian x-y plane, and an exemplary test board (FIG. 5C) for determining detector locations in accordance with the present invention. FIG. 5A shows an exemplary lens array 430, comprising first row of lenses 431, 433, 435 and 437 and second row of lenses 432, 434, 436 and 438. The second row of lenses 432, 434, 436 and 438 are substantially identical to the first row of lenses 431, 433, 435 and 437, except that their locations are offset in both the x- and y-directions.

FIG. 5B shows the target locations for the detectors that will detect the focused optical signals from the lenses 431-438. As shown, coordinates for the target center locations of the detectors that will receive optical signals focused by the first row of lenses 431, 433, 435 and 437 are (0,0), (x,0), (2x,0), and (3x,0). Each of the lenses 432, 434, 436 and 438 in the second row are offset from the nearest lenses in the first row along the x-axis by a value x/2. Thus, the coordinates for the target center locations of the detectors that will receive optical signals focused by the second row of lenses 432, 434, 436 and 438 are (x/2,y), (3x/2,y), (5x/2,y), and (7x/2,y).

FIG. 5C shows an exemplary test board 450 for determining optimal locations the detectors to receive the focused optical signals from the lenses 431-438. Test board 450 includes alignment pins 405*a-b* configured to mate with alignment holes 105*a-b* in optical receiver housing 110', and thus align the beam position detectors 451-458 with the lenses 431-438. Alignment pins 405*a-b* may be further configured to reversibly secure the test board 450 a predetermined distance away from the optical receiver housing 110'.

By the same methodology described herein, light having a wavelength in each of eight different bands is focused by the lenses 431-438, and the beam position detectors 451-458 determine the (x,y) or (x,y,z) coordinates of the focal point of the light in each band. The coordinates are recorded and input into the detector placement equipment for precision positioning on a circuit board placed in the optical receiver, as described herein. The detectors are then placed such that their centers are located at the coordinates identified or determined by the beam position detectors 451-458, and the receiver can function in an optimal manner, minimizing optical power losses, maximizing sensitivity, and increasing manufacturing yields.

An Exemplary Method of Aligning Detectors in a Multi-Channel Optical or Optoelectronic Device FIG. 6 is a flow diagram illustrating an exemplary method 500 of aligning detectors in a multi-channel optical or optoelectronic device. The method starts at 501, and at 503, the demultiplexer, the lenses, and any mirror(s) between the demultiplexer and the lenses are placed, secured, affixed or mounted in or on the optical device housing, as described herein. For example, the demultiplexer may first be secured (e.g., by adhesion using a glue or other adhesive) to the demultiplexer mount, then the demultiplexer mount may be placed, secured, mounted or affixed to the optical assembly housing. In one embodiment, the demultiplexer mount is placed in an initial location on the optical assembly housing a UV-active glue or adhesive, then the individual beams from the demultiplexer are aligned with the lenses (e.g., actively aligned in accordance with the disclosure of U.S. patent application Ser. No. 13/735,735, filed Jan. 7, 2013 before permanently securing the demultiplexer mount to the optical assembly housing by irradiating the UV-active glue/adhesive with UV radiation. A test strip, test board or other beam position detector may be mounted onto or otherwise secured to the optical device housing alignment pins and alignment holes, as described herein.

At 505, light having the wavelengths (e.g., center wavelengths) or wavelength bands of the multi-channel optical signal to be received by the optical receiver is transmitted to the demultiplexer, for example through an optical fiber connected to the optical assembly housing at a connector or other connection location. As described herein, the demultiplexer separates the multi-channel light into individual beams having a characteristic center wavelength or wavelength band, and the individual beams are focused by the lenses as described herein.

At 507, the focal points of the individual light beams are determined using the techniques and equipment described herein. For example, a test board or test strip may be secured to the optical assembly housing alignment pins and alignment holes, then the focal points of the individual light beams can be determined using position-sensitive photodetectors (e.g., low-resolution image sensors). In one embodiment, the depth or distance (e.g., z-axis) of the focal point of the light beams can be determined by this method, based on the area of the beam spot (e.g., the number or area of pixels in the image sensor detecting light). If an adjustment in the height of the signal detector is helpful to optimize or maximize focusing the optical signal onto the detector, then additional adhesive may be added when attaching the detector to the printed circuit board or other substrate.

At 509, coordinates (e.g., [x,y] coordinates or [x,y,z] coordinates) are assigned to each focal point location determined at 507. Then, at 511, a detector is placed, mounted or adhered at each of the locations defined by the coordinates determined at 509, as described herein.

Thus, the focal points of different wavelengths (or wavelength bands) of a received multi-channel optical signal may be determined prior to mounting or affixing the optical signal detectors to the optical receiver housing. The focal points may be assigned a set of coordinates (e.g., x,y coordinates) relative to a specific point or origin in or on the optical receiver assembly housing. Because distances between the focal points of the individual optical signals are not necessarily equal (e.g., due to alignment errors, flaws or defects in one or more mirrors, filters, lenses, etc.), individual optical signals may not be aligned precisely with their target locations. The present method determines more precise locations of the focal points of individual signals in a multi-channel optical signal to address the problems and/or issues arising as a result of such focal point misalignment.

CONCLUSION(S)

Embodiments of the present invention advantageously provide for a detector array on a sub-mount that is custom built for each receiver optical sub-assembly (ROSA). Thus, optimized one-step alignment can be achieved. The present invention enables individual detector arrays which are optimally matched for use with specific ROSA units. By determining an ideal location for each detector prior to formation of the detectors, each detector array may be individually optimized. Thus, an extra degree of alignment freedom can come from the detector placement itself.

In this manner, all of the optical signal detectors in an optical or optoelectronic receiver may be individually positioned for optimal reception of the focused optical signal. Furthermore, information relating to optimal placement of the optical signal detectors may be stored for placement of the detectors inside or outside the receiver optical (sub)assembly. The information can then be used to place, adhere or mount the detectors on a circuit board or other substrate in a customized manner for each receiver. For example, a serial number may be assigned to each receiver that is manufactured. The serial number may be associated with a corresponding set of coordinates which inform the detector placement equipment of the exact locations for placing the detectors in that receiver.

The individual placement of the optical signal detectors for each receiver enables manufacture of optical transceivers having detectors that may not be aligned with each other along an axis, or may not be spaced apart from each other at equal or predetermined distances. Thus, a further degree of freedom with regard to detector alignment is enabled, permitting idealized placement of multiple components in each receiver optical (sub)assembly.

While the above examples include particular implementations of registers and other memory arrangements, as well as multiplexers and comparators, one skilled in the art will recognize that other technologies and arrangements may also be used in accordance with embodiments. For example, other digital logic or elements can be used in certain embodiments. Further, one skilled in the art will recognize that other forms of signaling and/or control (e.g., current-based signaling, flag-based signaling, differential signaling, etc.) may also be used in accordance with various embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A multi-channel optical or optoelectronic device, comprising:
a demultiplexer configured to (i) receive a multi-channel optical signal having each of a plurality of wavelengths or wavelength bands and (i) separate the multi-channel optical signal into individual optical signals, each individual optical signal having a unique wavelength or wavelength band;
a plurality of detectors on or affixed to a detector mounting substrate, wherein each detector is configured to detect light having one of the unique wavelengths or wavelength bands, each unique wavelength or wavelength band of the plurality of wavelengths or wavelength bands corresponding to a channel of the multi-channel optical or optoelectronic device; and
a corresponding plurality of lenses on or affixed to an interior surface of the multi-channel optical or optoelectronic device, each of the plurality of lenses configured to focus light of the unique wavelength or wavelength band towards a corresponding one of the detectors, wherein each detector has a location aligned with an actual focal point of the light having the unique wavelength or wavelength band focused by a corresponding one of the lenses.

2. The device of claim 1, wherein the detector mounting substrate comprises a circuit board.

3. The device of claim 1, wherein each detector comprises a photodiode configured to absorb light of the unique wavelength or wavelength band.

4. The device of claim 1, further comprising an aperture or opening configured to (i) secure a fiber carrying the light having the plurality of wavelengths or wavelength bands and (ii) direct the light towards the demultiplexer.

5. The device of claim 1, wherein the demultiplexer comprises a plurality of filters and/or beam splitters, and each filter and/or beam splitter is configured to separate one of the individual optical signals from a received signal having a plurality of the individual optical signals.

6. The device of claim 1, wherein the plurality of detectors are along an axis, the plurality of detectors have target locations defined by a set of coordinates (0,0), (x,0), (2x,0), . . . (n·x,0), where x is a center-to-center spacing of the detectors and n is one less than a number of the detectors in the device, and the plurality of detectors have actual locations of ([m·x]±a, 0±b), where m is the number of detectors between the positioned detector and a first detector, a is an offset of the actual focal point along the axis from the corresponding target location, and b is an offset of the actual focal point along an orthogonal axis from the target location.

7. A receiver optical subassembly (ROSA), comprising the device of claim 2 and a surface on which the device is located, facing the circuit board.

8. A transceiver, comprising the device of claim 2 and a plurality of amplifiers mounted on the circuit board, each of the plurality of amplifiers amplifying an electrical signal output by a corresponding one of the detectors.

9. The device of claim 3, wherein each detector chip has an area of about 5,000 $\mu m^2$ to 500,000 $\mu m^2$.

10. The device of claim 3, wherein the detectors are spaced apart from one another such that a distance from a center of one detector to a center of an adjacent detector is about 200 $\mu m$ to 5,000 $\mu m$.

11. The device of claim 5, further comprising a plurality of mirrors, each configured to reflect the individual optical signal separated by the corresponding filter and/or beam splitter towards the corresponding lens.

12. A method of forming an optical or optoelectronic device, comprising:
placing a plurality of lenses on a surface of an optical or optoelectronic device housing or package;
transmitting light having a plurality of wavelengths or wavelength bands through the plurality of lenses, each of the plurality of wavelengths or wavelength bands corresponding to one of the lenses;
determining an actual focal point of each of the plurality of lenses;
determining a plurality of locations on a detector mounting substrate in the optical or optoelectronic device housing or package aligned with the actual focal points of the plurality of lenses; and
after determining the plurality of locations, placing, adhering or mounting a detector at or on each location.

13. The method of claim 12, wherein the detector mounting substrate comprises a printed circuit board, and determining the plurality of locations comprises mapping coordinates of each actual focal point on the printed circuit board.

14. The method of claim 12, wherein each detector detects a unique wavelength or wavelength band of light.

15. The method of claim 12, wherein the detectors are spaced apart from one another such that a distance from a center of one detector to a center of an adjacent detector is about 200 $\mu m$ to 5,000 $\mu m$.

16. The method of claim 12, further comprising storing information relating to the plurality of locations and using the stored information to place, adhere or mount each detector.

17. The method of claim 12, wherein the plurality of detectors are along an axis, the plurality of detectors have target locations defined by a set of coordinates (0,0), . . . (n·x,0), where x is a center-to-center spacing of the detectors and n is a number of the detectors in the device, and the plurality of detectors have actual locations of ([m·x]±a, 0±b), where m is the number of detectors between the positioned detector and a first detector, a is an offset of the actual focal point along the axis from the corresponding target location, and b is an offset of the actual focal point along an orthogonal axis from the target location.

18. The method of claim 13, further comprising, after determining the plurality of locations, assigning coordinates to each of the locations.

19. The method of claim 18, wherein a first set of coordinates is assigned to a first detector, and the remaining coordinates are assigned relative to the first set of coordinates.

20. The method of claim 19, wherein placing, adhering or mounting each detector comprises placing, adhering or mounting each detector at or on its corresponding location using its assigned coordinates.

* * * * *